United States Patent
Mitlehner et al.

(10) Patent No.: US 6,653,666 B2
(45) Date of Patent: Nov. 25, 2003

(54) J-FET SEMICONDUCTOR CONFIGURATION

(75) Inventors: Heinz Mitlehner, Uttenreuth (DE); Ulrich Weinert, Herzogenaurach (DE)

(73) Assignee: SiCED Electronics Development GmbH & Co. KG, Erlangen (DE)

( * ) Notice: Subject to any disclaimer, the term of this patent is extended or adjusted under 35 U.S.C. 154(b) by 0 days.

(21) Appl. No.: 09/767,419

(22) Filed: Jan. 23, 2001

(65) Prior Publication Data

US 2002/0020849 A1 Feb. 21, 2002

Related U.S. Application Data

(63) Continuation of application No. PCT/DE99/02148, filed on Jul. 12, 1999.

(30) Foreign Application Priority Data

Jul. 23, 1998 (DE) .......................... 198 33 214

(51) Int. Cl.$^7$ .......................................... H01L 21/332
(52) U.S. Cl. .................... 257/134; 257/77; 257/135; 257/136; 257/196; 257/197; 438/137; 438/138; 438/931; 438/173; 438/192
(58) Field of Search .................... 257/134–136, 257/265, 287, 504, 196–197, 192, 498, 77; 438/136–138, 186, 156, 173, 192, 931

(56) References Cited

U.S. PATENT DOCUMENTS

| | | | | |
|---|---|---|---|---|
| 4,636,830 A | * | 1/1987 | Bhagat | 257/135 |
| 5,357,125 A | * | 10/1994 | Kumagi | 257/133 |
| 5,367,184 A | * | 11/1994 | Chantre | 257/192 |
| 5,391,895 A | * | 2/1995 | Dreifus | 257/77 |
| 5,391,897 A | * | 2/1995 | Nonaka | 257/136 |
| 5,554,561 A | * | 9/1996 | Plumton | 438/193 |
| 6,011,279 A | * | 1/2000 | Singh et al. | 257/77 |
| 6,097,046 A | * | 8/2000 | Plumton | 257/266 |
| 6,121,633 A | * | 9/2000 | Singh et al. | 257/77 |
| 6,180,958 B1 | * | 1/2001 | Cooper, Jr. | 257/77 |
| 6,281,521 B1 | * | 8/2001 | Singh | 257/77 |

FOREIGN PATENT DOCUMENTS

| | | |
|---|---|---|
| DE | 43 09 764 C2 | 1/1997 |
| DE | 196 29 088 A1 | 1/1997 |
| EP | 0 522 938 A1 | 1/1993 |

OTHER PUBLICATIONS

Published International Application No. WO 97/23911 (Stephani et al.), dated Jul. 3, 1997, as mentioned on p. 2 of the specification.
Trapezodial—Groove Schottky—Gate Vertical—Channel GaAs FET (GaAs Static Induction Transistor), (Campbell et al.), dated Jun. 1985.

* cited by examiner

*Primary Examiner*—Phat X. Cao
*Assistant Examiner*—Thao X. Le
(74) *Attorney, Agent, or Firm*—Laurence A. Greenberg; Werner H. Stemer; Ralph E. Locher

(57) ABSTRACT

J-FET having a first semiconductor region (2, 3), which comprises a first contact (7) with a highly doped contact layer (8) serving as a source disposed between two second contacts (9) serving as a gate on its first surface (4). The three contacts (7, 9) are each connected to a respective second semiconductor region (5, 6). The first and second semiconductor regions (2, 3, 5, 6) are of opposite conductivity types. The second semiconductor regions (5) connected to the second contacts (9) extend in the first semiconductor region (2, 3) below the second semiconductor region (6) that is connected to the first contact (7), with the result that the three second semiconductor regions (5, 6) at least partially overlap in a projection onto a horizontal plane and a channel region (11) is formed between the three second semiconductor regions (5, 6) in the first semiconductor region (2, 3).

15 Claims, 4 Drawing Sheets

J-FET SEMICONDUCTOR CONFIGURATION

CROSS-REFERENCE TO RELATED APPLICATION

This is a continuation of International Application PCT/DE99/02148, filed Jul. 12, 1999, which designated the United States.

BACKGROUND OF THE INVENTION

FIELD OF THE INVENTION

The invention relates to an FET semiconductor configuration and, in particular, a vertical J-FET semiconductor configuration having a first semiconductor region, which includes a first contact with a highly doped contact layer serving as a source that is between two second contacts serving as a gate on its first surface.

In power switching technology, fast switching elements are sought which have the lowest possible static and dynamic losses and which can be driven with a low outlay. Power components of this type are used e.g. as DC switches in converters for variable-speed drives or as AC voltage switches (1- or 3-phase) of motor branch circuits. The low power loss permits compact devices with high efficiency.

For reverse voltages of 600 V, 1200 V, 1800 V . . . , nowadays mainly silicon IGBTs are used which have a threshold voltage in the forward direction.

The disadvantage in this prior art, however, is that power derating occurs in highly dynamic motor controllers with bipolar IGBTs, on account of the switching losses caused by the bipolar stored charge.

Although the switching losses are drastically reduced by using fast unipolar power MOSFETS made of silicon, the on-state losses or the on resistivity in the reverse voltage ranges mentioned is considerable, and the chip areas have to be chosen to be large. This results in higher costs and is therefore often the decisive factor in favor of the IGBT.

The following have been proposed as improved FETs of this type: a MOSFET using Si technology (proposed by Tihany in DE 43 09 764 C2) and a vertical J-FET which, in particular, can be fabricated using SiC technology (proposed by Mitlehner et al. in WO 97/23911 A1). The J-FET according to this prior art has a second semiconductor region within a first semiconductor region below a contact. The first and second semiconductor regions are of opposite conductivity types. The second semiconductor region serves to shield the source from the drain and extends beyond the contact in a projection onto the surface of the semiconductor, so that at least one channel region is formed in the first semiconductor region. The channel region is bounded toward the bottom by the depletion zone of the pn junction formed between the first semiconductor region and the second semiconductor region and transports an electric current from or to the contact in an on state.

However, the second semiconductor regions within the first semiconductor regions are complicated to fabricate. In particular, it is difficult to fabricate the components in SiC, inter alia, because of the thermal properties thereof: the implantation must be carried out very accurately over the entire desired area of the second semiconductor region, since it is no longer possible subsequently to adapt the expansion of the second semiconductor region through diffusion in SiC. On the other hand, the fabrication of components with a high blocking capability in SiC is of interest since SiC has, compared with Si, a very high breakdown field strength and very good on-state properties.

SUMMARY OF THE INVENTION

It is accordingly an object of the invention to provide a switching element which overcomes the above-mentioned disadvantageous of the prior art switching elements of this general type, and specifically, to provide a low-loss, fast and short-circuit-proof switching element which is simple and thus cost-effective to fabricate. In this regard, reverse voltages are typically in the region of 600 V, 1200 V, 1800 V.

With the foregoing and other objects in view there is provided, in accordance with the invention a vertical J-FET semiconductor configuration that includes: a semiconductor region of a first conductivity type defining a first semiconductor region having a first surface; and a first contact with a highly doped contact layer serving as a source. The first contact is disposed on the first surface. Two second contacts serve as a gate. The first contact is disposed between the two second contacts. Three second semiconductor regions are of a second conductivity type that is opposite the first conductivity type. A first one of the second semiconductor regions is connected to the first contact. A second one of the second semiconductor regions is connected to one of the two second contacts. A third one of the second semiconductor regions is connected to another one of the two second contacts. The second one of the second semiconductor regions and the third one of the second semiconductor regions extend in the first semiconductor region below the first one of the second semiconductor regions. The three second semiconductor regions at least partially overlap in a projection onto a horizontal plane. At least one channel region is formed in the first semiconductor region and between the three second semiconductor regions.

According to the invention, in contrast to the prior art, at least some of the second semiconductor regions are not produced as "islands", over which a further epitaxial layer is then configured. Rather all of the second semiconductor regions are produced as areas at the surface of the component. The design of the semiconductor element according to the invention is very much simpler in terms of production engineering and that enables the component to be fabricated in a particularly cost-effective manner from materials which are difficult to handle, such as SiC.

The J-FET semiconductor configuration according to the invention is characterized in that the three contacts are each connected to a second semiconductor region. The first and second semiconductor regions are of opposite conductivity types. The second semiconductor regions that are connected to the second contacts extend in the first semiconductor region below the second semiconductor region that is connected to the first contact, with the result that the three second semiconductor regions at least partially overlap in a projection onto a horizontal plane and at least one channel region is formed between the three second semiconductor regions in the first semiconductor region.

In accordance with an added feature of the invention, the first contact has at least one cutout, so that there is an electrical contact between the first contact and the second semiconductor region under the second contact. This avoids floating of the second semiconductor region.

In accordance with an additional feature of the invention, dielectric passivation of the component is provided. The dielectric passivation layer is provided in each case between the first contact and the second contact on the surface of the first semiconductor region and is formed by either an oxide layer or a semiconductor layer which is doped in such a way that it has an opposite conductivity type to that of the first semiconductor region. Greater stability is achieved as a result of this.

One advantage of the invention is that the power loss of the J-FET semiconductor configuration according to the invention is approximately one order of magnitude below that of conventional Si-IGBTs in this power range. Moreover, the linear expansion of the vertical drift region $W_{ch\ vert}$ can be chosen to be large since the second semiconductor region under the highly doped contact layer of the first contact (=source) provides for the necessary shielding without adversely affecting the reverse voltage.

A further advantage of the invention is that the output capacitance is low since a large-area second semiconductor region is attached to the highly doped contact layer of the first contact (=source). This also results in a further decrease in the switching losses since the charge reversal of the second contact (=gate) is reduced.

Furthermore, the static losses of the J-FET according to the invention are particularly low since the drift zone is utilized optimally.

Other features which are considered as characteristic for the invention are set forth in the appended claims.

Although the invention is illustrated and described herein as embodied in a J-FET semiconductor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The on-state losses of a unipolar power component are determined, in addition to the substrate and contact resistances, principally by the channel and the drift resistances of the relatively lightly doped n-type zone of the field-effect transistor, which zone takes up the voltage. If J-FET structures are considered as so-called normally on components which can be switched off, or if J-FETs combined with low-voltage MOSFETs in a cascode are considered as normally off components, then the drift resistance and thus the on-state losses of the J-FET can be reduced by achieving maximum conductivity of the drift zone by optimal utilization of the chip area for current propagation.

According to the invention, this is achieved by configuring the shielding of the drain voltage from the source region in these partial regions in such a way that the current propagation is minimally impaired in a first n-doped epitaxial region. This is achieved by a p-type implantation with a high dose in accordance with Poisson's equation for the maximum field in the corresponding semiconductor material, in this case preferably SiC, which is coupled directly to the $n^{++}$-doped source region. In experimental measurements, with such a design, the entire second epitaxial zone below the source was depleted at as little as approximately 15 V. In this case, the lateral expansion of the vertical channel $W_{ch\ vert}$ can be chosen freely in a very large interval since the p-type zone under the $n^{++}$-doped source region provides for the necessary shielding without adversely affecting the reverse voltage. In this case, the emitter efficiency of the small-area emitter edge is entirely sufficient even for high currents—as generally known by the person skilled in the art.

Furthermore, as a particular advantage, with the design according to the invention the output capacitance can be kept low since large-area p-type regions are attached to the $n^{++}$-doped source input (short-circuited). Therefore, the switching losses also remain low since the charge reversal of a large-area part of the gate is borne by the input load circuit.

In order to increase the stability, a dielectric passivation layer (e.g. made of $SiO_2$) or a further p-type implantation, which acts as pn insulation, can be provided at the side edges of the second epitaxial layer on which the source contact is situated.

These features are explained in more detail below using two exemplary embodiments. The starting point in this case is an n-doped substrate. However, the invention is not restricted to this conductivity type, and it goes without saying that it is possible, in principle, to choose opposite conductivity types to all those which are mentioned in the description.

Figure 1:
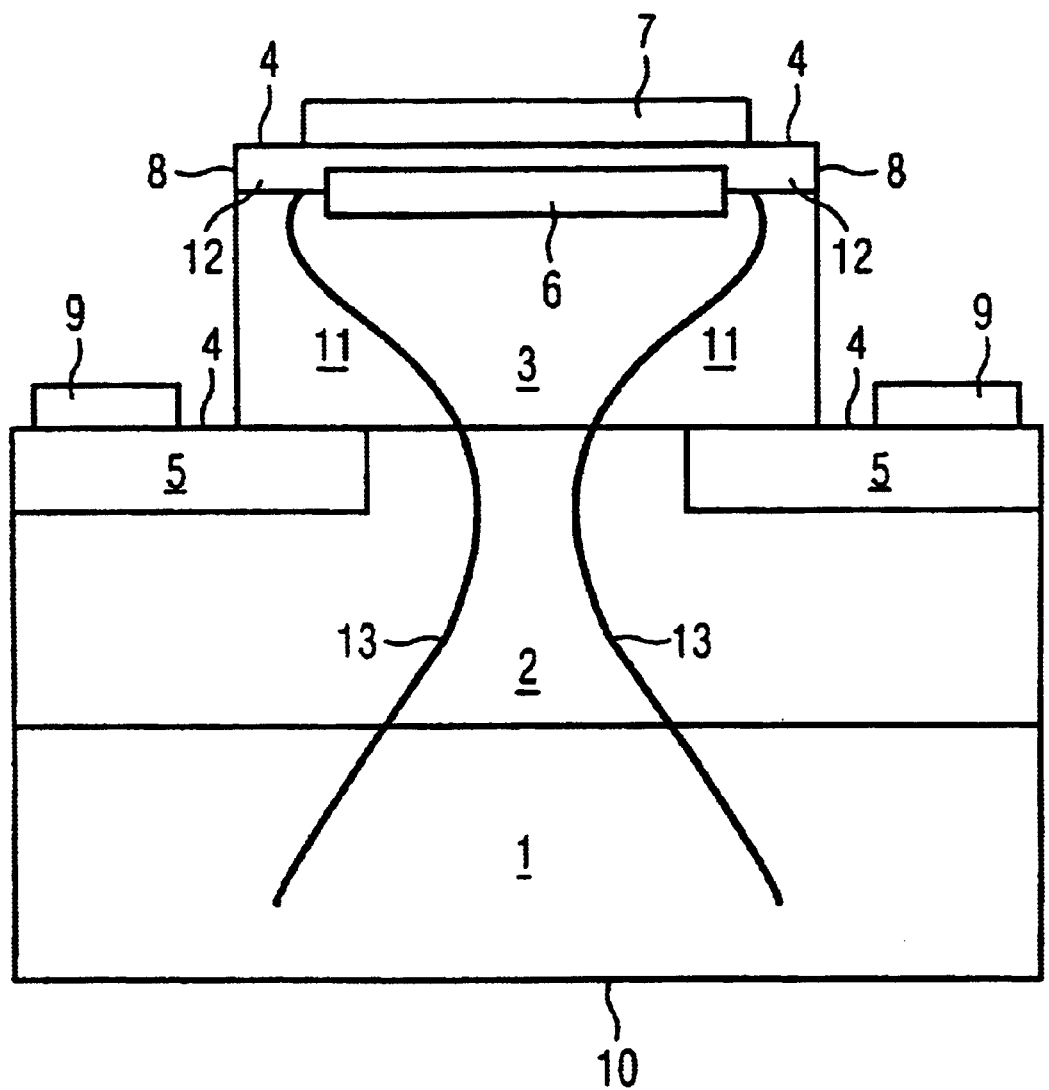
FIG. 1 shows a first embodiment of the invention.

Referring now to the figures of the drawing in detail and first, particularly, to FIG. 1 thereof, there is shown a cross sectional view of a first embodiment of an inventive J-FET semiconductor configuration made of SiC. In this case, 1 designates a substrate on which the further epitaxial layers are applied. The conductivity type of the substrate 1 is the n type in the embodiment shown. There is a drain contact 10 on the underside of the substrate 1, via which drain contact 10 a current through the substrate 1 flows away.

A first semiconductor region is applied as a first n-doped epitaxial layer 2 on the substrate 1. Gate contacts 9 are configured on the surface 4 of the epitaxial layer 2, via which gate contacts, the resistance in the drift region, i.e. in the first semiconductor region, can be set externally. The gate contacts 9 are configured at the same height, and, by means of the voltage between the gate contact 9 and a source contact 7, the charge carriers are depleted in the region between the two gate contacts 9 at the same height and thus the drift resistance is increased: the transistor starts to turn off.

In the J-FET semiconductor configuration according to the invention, a second n-doped epitaxial layer 3 is applied above the first epitaxial layer 2 and between the two gate electrodes 9, and constitutes a continuation of the first semiconductor region, thereby producing a contiguous first semiconductor region (epitaxial layers 2 and 3). The uncovered surface 4 of the second epitaxial layer 3 is heavily doped, i.e. $n^{++}$-doped, thereby producing an ohmic contact layer 8 which serves as a source and via which charge carriers are injected into the semiconductor from the source contact 7.

FIG. 1 illustrates the current path from the source 7 between the gate contacts 9 through to the drain 10 using two current lines 13 in the drift region.

It is an essential feature of the invention to arrange a second semiconductor region 6 directly adjacent to the source contact 7, which is doped in such a way that it is of the opposite conductivity type relative to the first semiconductor region 2. In other words, directly under the contact layer 8 of the source, according to the invention a second semiconductor region 6 is implanted as a p-doped island. In this case, the desired doping profile is established by the penetration profile during ion implantation by setting the ion energy.

The second semiconductor region 6 shields the source 7 from the drain 10. The area covered by the p-doped second semiconductor region 6 under the source contact 7 is preferably centered under the contact 7. To ensure, however, that the current flow from the source 7 into the semiconductor is not obstructed to an excessive degree, the p-doped region does not cover the entire lateral extent of the contact layer 8, but rather an edge region 12 of the contact layer 8 remains free. Current flows from the source contact 7 into the semiconductor via this edge region 12. The efficiency of the edge of the contact layer 8 is sufficient, even for high currents, and has already been utilized by the applicant in conventional Si ring emitter transistors in the prior art.

However, since a punch-through from the drain 10 to the source 7 is possible via the edge region 12 of the $n^{++}$-type contact layer 8, respective second semiconductor regions 5 are likewise implanted as p-doped regions under the gate contacts 9. The second semiconductor regions 5 extend laterally along the surface 4 of the first epitaxial layer 2 into the first semiconductor region. In particular, these p-doped regions may form a contiguous region, with the result that, as seen from above, the source 7 is "encircled" in a "ring" formed by the gate 9. In this case, the geometrical configuration of the p-doped islands in the n-doped first semiconductor region is chosen such that the two second semiconductor regions 5 under the gate contacts 9 extend into the first semiconductor region of the first epitaxial layer 2 to an extent such that, in a projection onto a plane in which the second semiconductor region 6, which is connected to the source, is situated, they at least partially overlap the second semiconductor region 6, i.e. in particular at the edge. As a result, a punch-through from the drain to the source is minimized and the control channel 11 is defined by the expansion $W_{ch\ vert}$.

Running between the second semiconductor regions 5 under the gate 9 and the second semiconductor region 6 under the source 7, there is a channel region 11 bounded by the depletion zone of the pn junction formed between the first semiconductor region and the second semiconductor region. The current flow through the channel region 11 is indicated by a few current lines 13. They issue at the edge, edge region 12, of the contact 8 of the source next to the shielding by the second semiconductor region 6 and run through the first semiconductor region of the second layer 3 in such a manner that they become closer between the second semiconductor region 5 at the gate 9 and the second semiconductor region 6 at the source 7. Below the second semiconductor regions 5 of the gate, the current density becomes lower again, i.e. the current lines diverge.

With a J-FET semiconductor configuration according to FIG. 1, the available area in the semiconductor is utilized to a high degree for current propagation without thereby adversely affecting the reverse voltage in the crucial partial regions or the shielding of the source region from the drain potential.

Advantageous applications of the invention may be found in converter applications, in particular. In converter applications, the switching components must be operated "normally off". For example, in the event of a current failure, e.g. in the driving of the gate, all of the switching elements should automatically attain the blocking state. This is possible in a particularly simple manner with the inventive J-FET semiconductor configuration with a high blocking capability, by realizing a cascode circuit in which a low-voltage MOSFET or a low-voltage SMART-FET is connected upstream of the SiC J-FET. It is possible for the low-voltage FET to be fabricated using known Si technology in each case. In the case of a cascode circuit of this type, it is possible to construct the control of the semiconductor component with a high blocking capability by means of an Si MOSFET with the well-mastered Si technology. A further advantage of a low-voltage MOSFET connected upstream is that a freewheeling diode which is required in invertors with an inductive load is obviated since the built-in diode of the low-voltage MOSFET acts as a freewheeling diode even for the high reverse voltages of the cascode.

Figure 2:
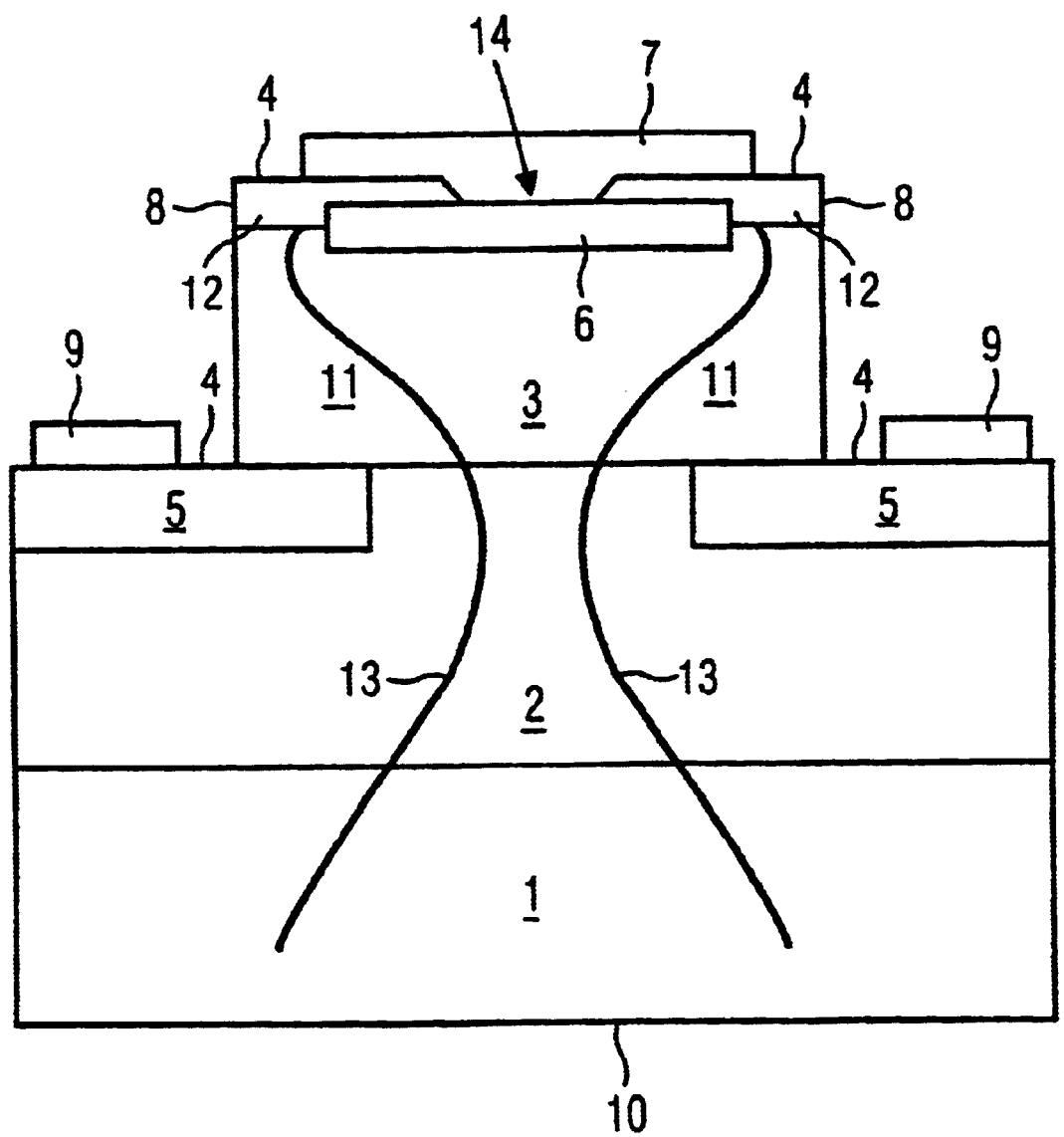
FIGS. 2 to 4 show a second embodiment of the invention.

In a further embodiment of the invention which is illustrated in FIG. 2, an electrical connection is provided between the source electrode 7 and the second semiconductor region 6 under the source. As a result, the potential of the second semiconductor region 6 is unambiguously defined, and "floating" of the second semiconductor region 6 is avoided: the contact is made by a cutout 14 in the $n^{++}$-type contact layer 8, which is filled with a metallization layer which also forms the source contact 7, so that the source 7 is short-circuited with the second semiconductor region 6 which is an island. In addition to the embodiment with just a single cutout 14, the embodiment with a plurality of smaller cutouts is also possible. In practice, the choice between one large and a plurality of smaller cutouts through to a porous nature of the $n^{++}$-layer 8 between the source 7 and the second semiconductor region 6 is determined by the mechanical and electrical requirements in the fabrication of the component.

The remaining regions in the embodiment according to FIG. 2 correspond to those in FIG. 1 with the same reference numeral in each case.

Figure 3:
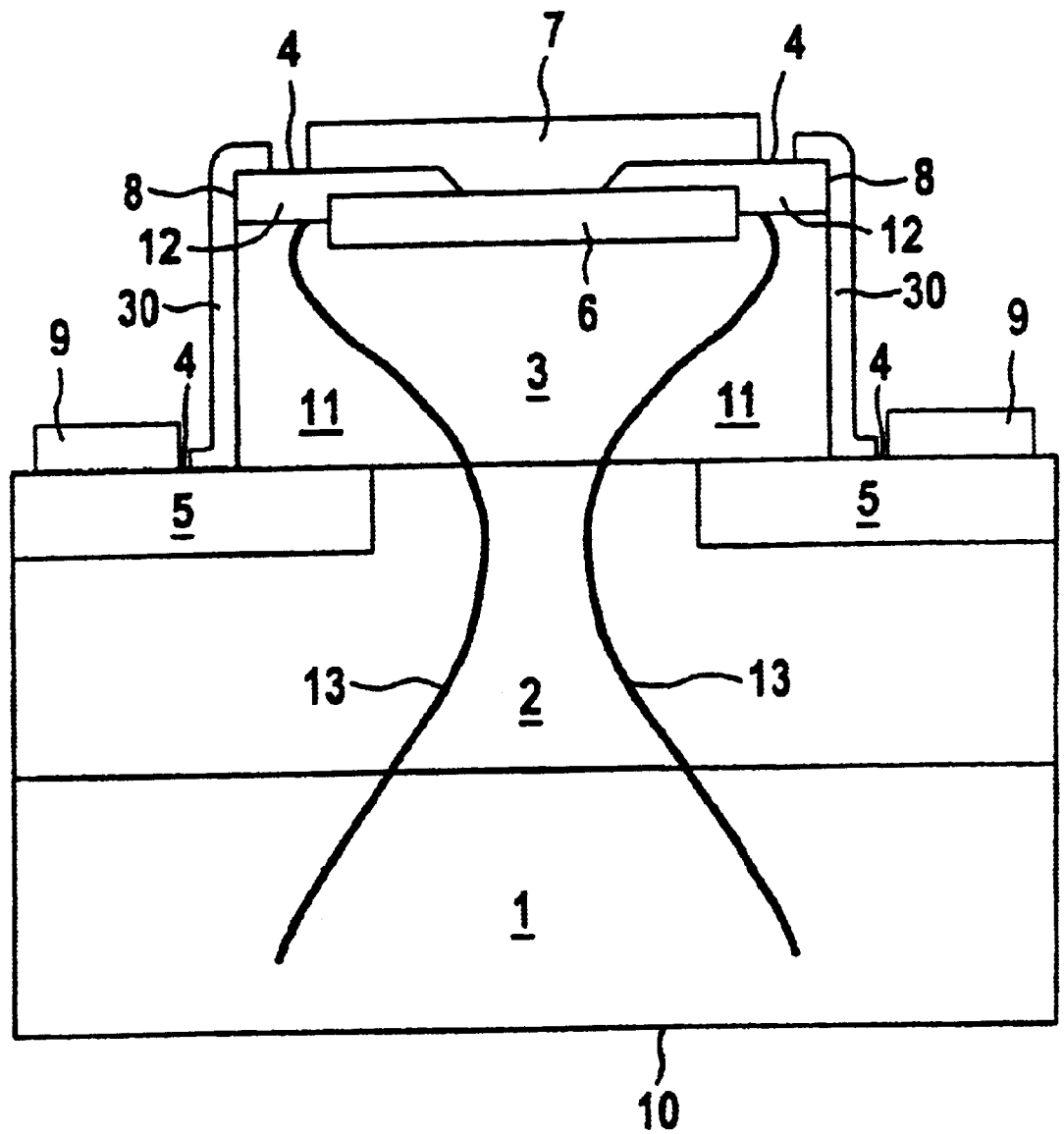

In a further embodiment of the invention which is illustrated in FIG. 3, dielectric passivation is provided at the side edges 30 of the second, mesa-like epitaxial layer 3 on which the source contact 7 is situated, which passivation acts as pn insulation. The dielectric passivation serves to increase the stability and may be composed of $SiO_2$ or be a doped layer whose conductivity type is opposite to the conductivity type of the first semiconductor region.

The remaining regions in the embodiment according to FIG. 3 correspond to those in FIG. 2 with the same reference numeral in each case.

Figure 4:
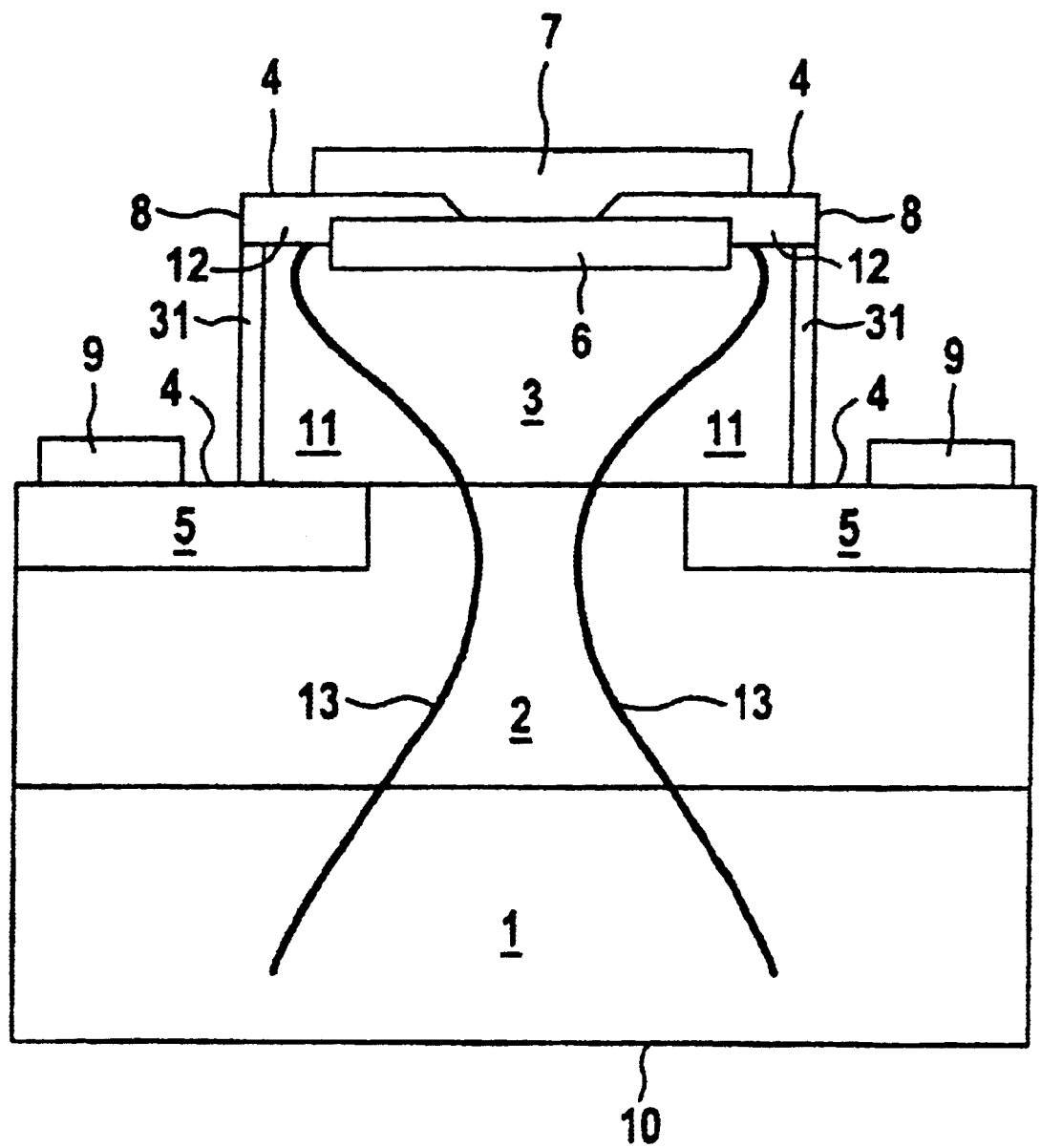

In a further embodiment of the invention, which is illustrated in FIG. 4 a passivation layer is provided as a semiconductor layer 31. The p-doped semiconductor layer 31, is located at the edge of the "mesa like" epitaxial layer 3, which contains the channel region 11. Another pn-junction is formed between the semiconductor layer 31 and the channel region 11.

The remaining regions in the embodiment according to FIG. 4 correspond to those in FIG. 2 with the same reference numeral in each case.

The fact that the structure of the J-FET semiconductor configuration according to the invention is easier to realize than a structure having implanted "islands" in the substrate opens up further and improved possibilities for using SiC as semiconductor material for components of this type. As a result, it is possible to achieve a higher blocking capability in conjunction with improved on-state properties: particularly low static losses can be realized since the drift zone is utilized particularly well in the design according to the invention.

Moreover, the direct switching losses, on account of the small gate capacitance, remain low in the case of the design of the vertical J-FET according to the invention. In the case of the structure according to the invention, it is also possible to combine the J-FET with e.g. a low-voltage SIPMOS in a cascode, so that many control and monitoring functions at the 50 V level can be covered using the component according to the invention.

It is advantageously possible, after a (relatively shallow) trench etching, resulting in a height of approximately 2 μm between the gate contact 9 and the source 7, to make contact with the proposed structure of a vertical J-FET in SiC in a "net-like" manner at the gate, with the result that a high cell density, i.e. high material utilization, can be achieved.

We claim:

1. A vertical J-FET semiconductor configuration, comprising:

a semiconductor region of a first conductivity type defining a first semiconductor region having a first surface;

a first contact with a highly doped contact layer serving as a source, said first contact disposed on said first surface;

two second contacts serving as a gate, said first contact disposed between said two second contacts;

three second semiconductor regions being of a second conductivity type that is opposite said first conductivity type, a first one of said second semiconductor regions being short-circuited with said first contact and having a width smaller than that of said highly doped contact layer, a second one of said second semiconductor regions connected to one of said two second contacts, a third one of said second semiconductor regions connected to another one of said two second contacts;

said second one of said second semiconductor regions and said third one of said second semiconductor regions extending in said first semiconductor region below said first one of said second semiconductor regions;

said three second semiconductor regions at least partially overlapping in a projection onto a horizontal plane;

at least one channel region formed in said first semiconductor region and between said three second semiconductor regions; and a current path leading from said first contact and running only though said first semiconductor region at least until passing said second one of said second semiconductor regions and said third one of said second semiconductor regions.

2. The vertical J-FET semiconductor configuration according to claim 1, wherein said contact layer has at least one cutout enabling an electrical contact between said first contact and said first one of said second semiconductor regions under said first contact.

3. The vertical J-FET semiconductor configuration according to claim 1, comprising a dielectric passivation layer disposed between said first contact and said second contact on said first surface of said first semiconductor region.

4. The vertical J-FET semiconductor configuration according to claim 3, wherein said passivation layer includes an oxide layer.

5. The vertical J-FET semiconductor configuration according to claim 3, wherein said passivation layer includes a semiconductor layer that is doped to have a conductivity type that is opposite to that of said first semiconductor region.

6. The vertical J-FET semiconductor configuration according to claim 1, wherein said first semiconductor region is fabricated from SiC.

7. A vertical J-FET semiconductor configuration, comprising:

a semiconductor region of a first conductivity type defining a first semiconductor region having a first surface;

a first contact with a highly doped contact layer serving as a source, said first contact disposed on said first surface;

two second contacts serving as a gate, said first contact disposed between said two second contacts;

three second semiconductor regions being of a second conductivity type that is opposite said first conductivity type, a first one of said second semiconductor regions connected to said first contact, a second one of said second semiconductor regions connected to one of said two second contacts, a third one of said second semiconductor regions connected to another one of said two second contacts;

said second one of said second semiconductor regions and said third one of said second semiconductor regions extending in said first semiconductor region below said first one of said second semiconductor regions;

said three second semiconductor regions at least partially overlapping in a projection onto a horizontal plane;

at least one channel region formed in said first semiconductor region and between said three second semiconductor regions; and said contact layer having at least one cutout enabling an electrical contact between said first contact and said first one of said second semiconductor regions under said first contact.

8. The vertical JFET semiconductor configuration according to claim 7, further comprising a dielectric passivation layer disposed between said first contact and said second contact on said first surface of said first semiconductor region.

9. The vertical J-FET semiconductor configuration according to claim 8, wherein said passivation layer includes an oxide layer.

10. The vertical J-FET semiconductor configuration according to claim 8, wherein said passivation layer includes a semiconductor layer doped to have a conductivity type opposite to said first semiconductor region.

11. The vertical J-FET semiconductor configuration according to claim 7, wherein said first semiconductor region is fabricated from SiC.

12. A vertical J-FET semiconductor configuration, comprising:

a semiconductor region of a first conductivity type defining a first semiconductor region having a first surface;

a first contact with a highly doped contact layer serving as a source, said first contact disposed on said first surface;

two second contacts serving as a gate, said first contact disposed between said two second contacts;

three second semiconductor regions being of a second conductivity type that is opposite said first conductivity type, a first one of said second semiconductor regions connected to said first contact, a second one of said second semiconductor regions connected to one of said two second contacts, a third one of said second semiconductor regions connected to another one of said two second contacts;

said second one of said second semiconductor regions and said third one of said second semiconductor regions extending in said first semiconductor region below said first one of said second semiconductor regions;

said three second semiconductor regions at least partially overlapping in a projection onto a horizontal plane;

at least one channel region formed in said first semiconductor region and between said three second semiconductor regions; and a dielectric passivation layer disposed between said first contact and said second contact on said first surface of said first semiconductor region, said dielectric passivation layer having a semiconductor layer doped to have a conductivity type opposite to said first semiconductor region.

13. The vertical J-FET semiconductor configuration according to claim 12, wherein said contact layer has at least one cutout enabling an electrical contact between said first contact and said first one of said second semiconductor regions under said first contact.

14. The vertical J-FET semiconductor configuration according to claim 12, wherein said passivation layer includes an oxide layer.

15. The vertical J-FET semiconductor configuration according to claim 12, wherein said first semiconductor region is fabricated from SiC.

* * * * *